(12) United States Patent
Shen et al.

(10) Patent No.: US 11,259,405 B2
(45) Date of Patent: Feb. 22, 2022

(54) TRANSMISSION CIRCUIT BOARD AND METHOD FOR MANUFACTURING THE SAME

(71) Applicants: Avary Holding (Shenzhen) Co., Limited., Shenzhen (CN); QING DING PRECISION ELECTRONICS (HUAIAN) CO., LTD, Huai an (CN)

(72) Inventors: Fu-Yun Shen, Shenzhen (CN); Wen-Zhu Wei, Shenzhen (CN); Ming-Jaan Ho, New Taipei (TW)

(73) Assignees: Avary Holding (Shenzhen) Co., Limited., Shenzhen (CN); QING DING PRECISION ELECTRONICS (HUAIAN) CO., LTD, Huai an (CN)

( * ) Notice: Subject to any disclaimer, the term of this patent is extended or adjusted under 35 U.S.C. 154(b) by 0 days.

(21) Appl. No.: 17/036,563

(22) Filed: Sep. 29, 2020

(65) Prior Publication Data

US 2021/0345479 A1 Nov. 4, 2021

(30) Foreign Application Priority Data

Apr. 30, 2020 (CN) .......................... 202010366126.6
Apr. 30, 2020 (CN) .......................... 202010366162.2
Apr. 30, 2020 (CN) .......................... 202010367841.1

(51) Int. Cl.
| H05K 1/11 | (2006.01) |
| H05K 1/14 | (2006.01) |
| H05K 3/28 | (2006.01) |
| H05K 1/02 | (2006.01) |
| H05K 3/46 | (2006.01) |

(52) U.S. Cl.
CPC .......... *H05K 1/028* (2013.01); *H05K 1/0237* (2013.01); *H05K 3/4635* (2013.01)

(58) Field of Classification Search
CPC . H05K 1/11; H05K 1/14; H05K 1/111; H05K 1/114; H05K 1/118; H05K 1/142; H05K 3/28; H05K 3/365; H05K 2201/052; H05K 2201/09081
USPC ............. 174/254, 250, 255, 261; 349/1, 187
See application file for complete search history.

(56) References Cited

U.S. PATENT DOCUMENTS

| 2007/0194225 A1* | 8/2007 | Zorn | ...................... G01Q 10/06 250/306 |
| 2011/0175828 A1* | 7/2011 | Liu | ..................... G02F 1/13338 345/173 |

(Continued)

*Primary Examiner* — Xiaoliang Chen
(74) *Attorney, Agent, or Firm* — ScienBiziP, P.C.

(57) ABSTRACT

A transmission circuit board includes a bendable area, a first transmission areas, and a second transmission areas. The first and second transmission areas are connected to the bendable area. The inner circuit substrate board further includes a substrate layer and an inner circuit layer formed on the substrate layer and including a first signal circuit. The transmission circuit board further includes a first dielectric layer formed on the inner circuit layer, a first outer circuit layer formed on the first dielectric layer, a first protecting layer formed on the first outer circuit layer, and a first shielding layer formed on the first protecting layer. The first dielectric layer lies the first and second transmission areas. Two ends of the first signal circuit are connected to the first outer circuit layer. The first shielding layer is connected to the first outer circuit layer and lies the bendable area.

14 Claims, 12 Drawing Sheets

(56) References Cited

U.S. PATENT DOCUMENTS

2015/0359485 A1* 12/2015 Berg .................... A61B 5/6804
600/388
2019/0029112 A1* 1/2019 Pan .......................... H01Q 1/40

* cited by examiner

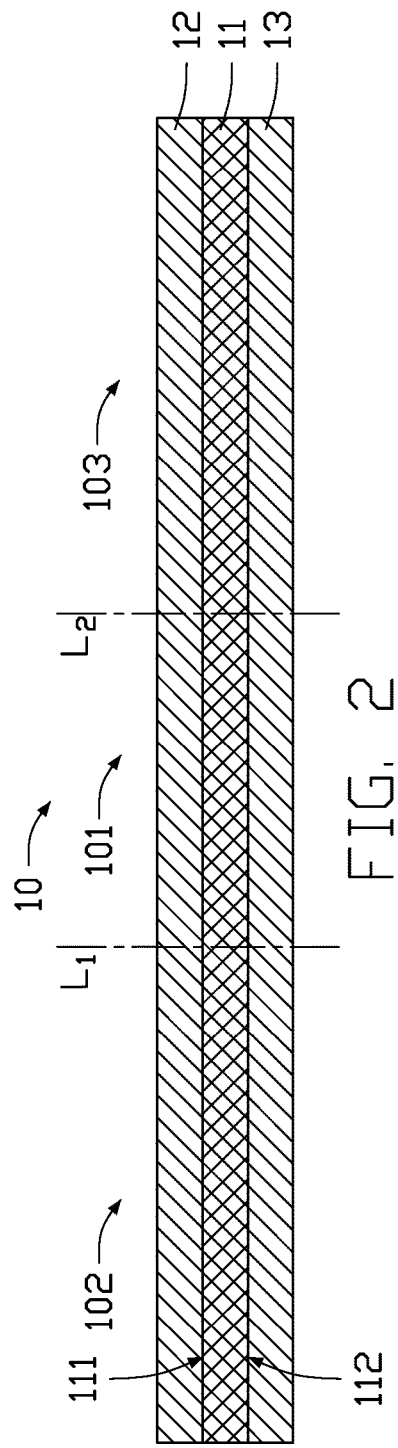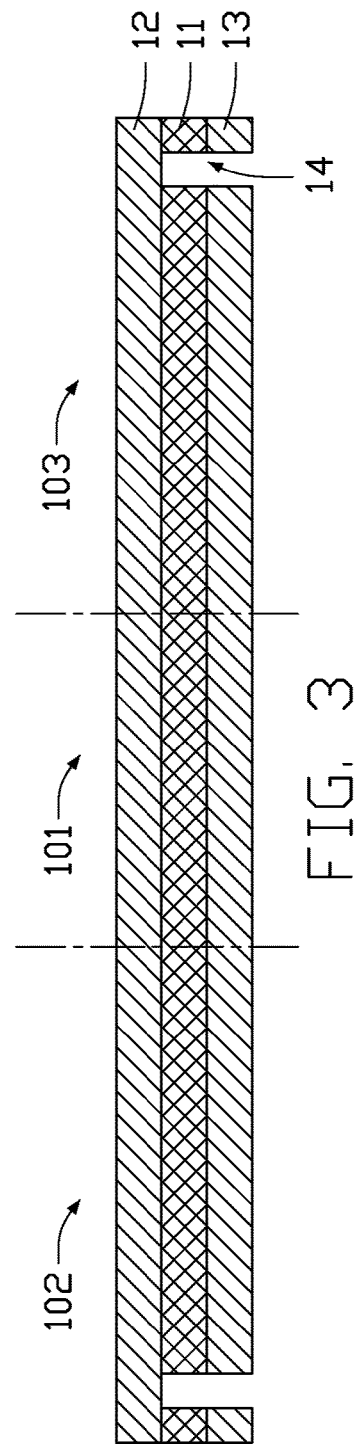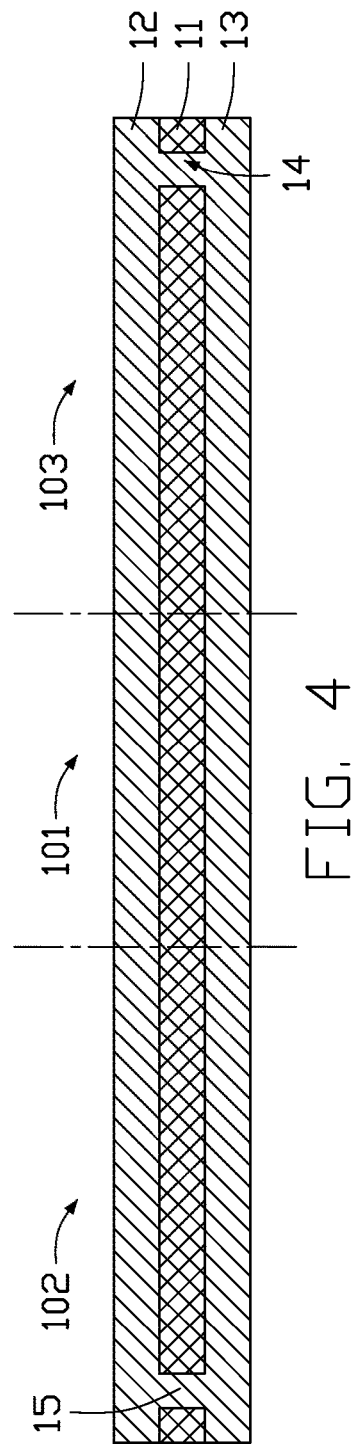

TRANSMISSION CIRCUIT BOARD AND METHOD FOR MANUFACTURING THE SAME

FIELD

The subject matter of the application generally relates to a transmission circuit board and a method for manufacturing the transmission circuit board.

BACKEARTH

With a development of wearable electronic technology, circuit boards need higher flex performance to meet needs of various parts of the body in motion. At the same time, the advent of the 5G technologies may require frequent and high efficiency of wireless transmissions. How to meet the dual needs of flexure and high-speed transmissions has become a hot topic in the circuit board making industries.

A current transmission circuit is a strip circuit, at least one signal circuit of the transmission circuit is located in a middle layer of the transmission circuit, and two earth layers are located on two sides of each signal circuit. In high-frequency transmission, a thicker transmission circuit results in less signal loss. However, as the thickness increases, the transmission circuit becomes less flexible, hence may be applicable to wearable products.

Therefore, there is room for improvement in the art.

BRIEF DESCRIPTION OF THE DRAWINGS

Implementations of the present disclosure will now be described, by way of embodiments, with reference to the attached figures.

FIG. 2 is a cross-section view of a first copper clad laminate.

FIG. 3 is a cross-section view showing at least two first blind holes are defined in the first copper clad laminate of FIG. 2.

FIG. 4 is a cross-section view showing at least two copper pillars are formed in the at least two first blind holes of FIG. 3.

DETAILED DESCRIPTION

Figure 1:
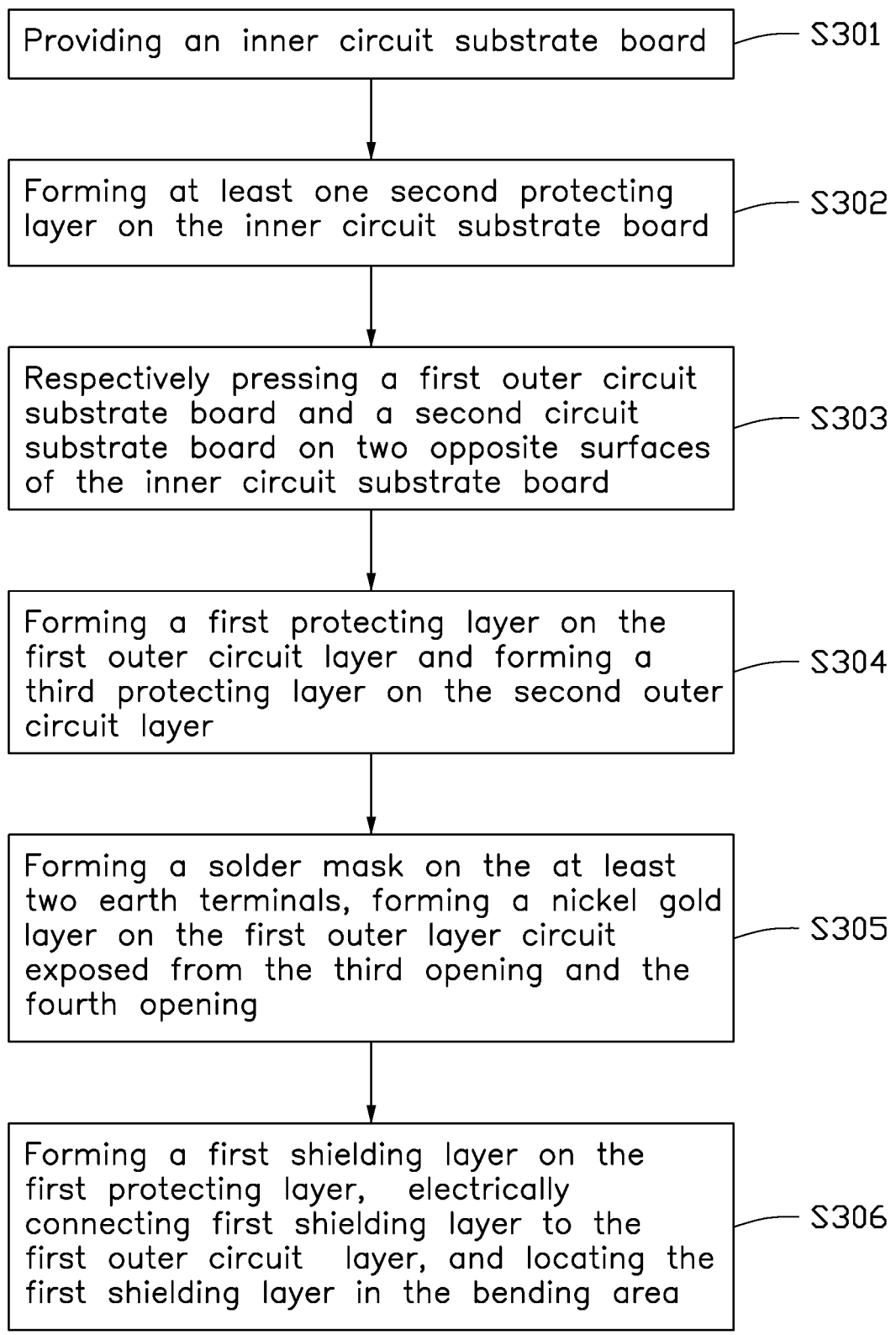
FIG. 1 is a flowchart of a method for manufacturing a transmission circuit board in accordance with an embodiment of the present disclosure.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale, and the proportions of certain portions may be exaggerated to better illustrate details and features of the present disclosure.

The disclosure is illustrated by way of example and not by way of limitation in the figures of the accompanying drawings, in which like references indicate similar elements. It should be noted that references to "an" or "one" embodiment in this disclosure are not necessarily to the same embodiment, and such references mean "at least one."

The term "comprising" when utilized, means "including, but not necessarily limited to"; it specifically indicates open-ended inclusion or membership in the so-described combination, group, series, and the like.

FIG. 1 illustrates a flow chart of a method for manufacturing a transmission circuit board 100 in accordance with an embodiment of the present disclosure. The example method is provided by way of example, as there are a variety of ways to carry out the method. The method described below can be carried out using the configurations illustrated in FIGS. 2-13, for example, and various elements of these figures are referenced in explaining the example method. Each block shown in FIG. 1 represents one or more processes, methods, or subroutines, carried out in the example method. Additionally, the illustrated order of blocks is by example only and the order of the blocks can change. The example method can begin at block 301.

At block 301, referring to FIGS. 2-5, an inner circuit substrate board 110 is provided.

The inner circuit substrate board 110 includes a bendable area 101, a first transmission area 102, and a second transmission area 103. The first transmission area 102 and the second transmission area 103 are connected to the bendable area 101. The first transmission area 102 and the second transmission area 103 both have a length that is greater than that of the bendable area 101.

In at least one embodiment, the inner circuit substrate board 110 includes a substrate layer 11 and an inner circuit layer 16 formed on the substrate layer 11. The substrate layer 11 is flexible. The inner circuit layer 16 includes at least one first signal circuit 161 and at least two earth circuits 162 located on opposite sides of the first signal circuit 161. The at least two earth circuits 162 are electrically insulated from the first signal circuit 161. In at least one embodiment, the first signal circuit 161 is located in the bendable area 101, the first transmission area 102, and the second transmission area 103. The at least two earth circuits 162 are located in the first transmission area 102 and Inside the second transmission area 103. At least two first blind holes 14 corresponding to the at least two earth circuits 162 are defined in the substrate layer 11. At least two copper pillars 15 are formed in the at least two first blind holes 14. One end of each copper pillar 15 is electrically connected to each earth circuit 162, and the other end of each copper pillar 15 is flush with or protrudes out of a surface of the substrate layer 11 away from the inner circuit layer 16. The at least two copper pillars 15 can enhance a bending resistance of the inner circuit substrate board located in the first transmission area 102 and the second transmission area 103.

In other embodiment, the at least two first blind holes 14 and the at least two copper pillars 15 may be omitted.

A material of the substrate layer 11 is selected from at least one of polyimide (PI), modified polyimide (MPI), polyethylene terephthalate (PET), polyethylene naphthalate (PEN), polyethylene (PE), Teflon, liquid crystal polymer (LCP), polyvinyl chloride polymer (PVC), Ajinomoto Build-up Film (ABF), and other materials. In at least one embodiment, the material of the substrate layer 11 is PI or MPI.

In at least one embodiment, referring to FIGS. 2-5, a method for manufacturing the inner circuit substrate board 110 includes:

Firstly, referring to FIG. 2, a first copper clad laminate 10 is provided.

In at least one embodiment, the first copper clad laminate 10 includes the substrate layer 11, a first copper layer 12, and a second copper layer 13. The substrate layer 11 includes a first surface 111 and a second surface 112 opposite to the first surface 111. The first copper layer 12 is formed on the first surface 111. The second copper layer 13 is formed on the second surface 112.

Secondly, referring to FIG. 3, at least two first blind holes 14 are defined in the first copper clad laminate 10. The at least two first blind holes 14 penetrate the second copper layer 13 and the substrate layer 11. The at least two first blind holes 14 are located in the first transmission area 102 and the second transmission area 103.

Thirdly, referring to FIG. 4, at least two copper pillars 15 are formed in the at least two first blind holes 14 by selective Plating. One of the at least two copper pillars 15 is corresponding to one of the at least two first blind holes 14.

Figure 5:
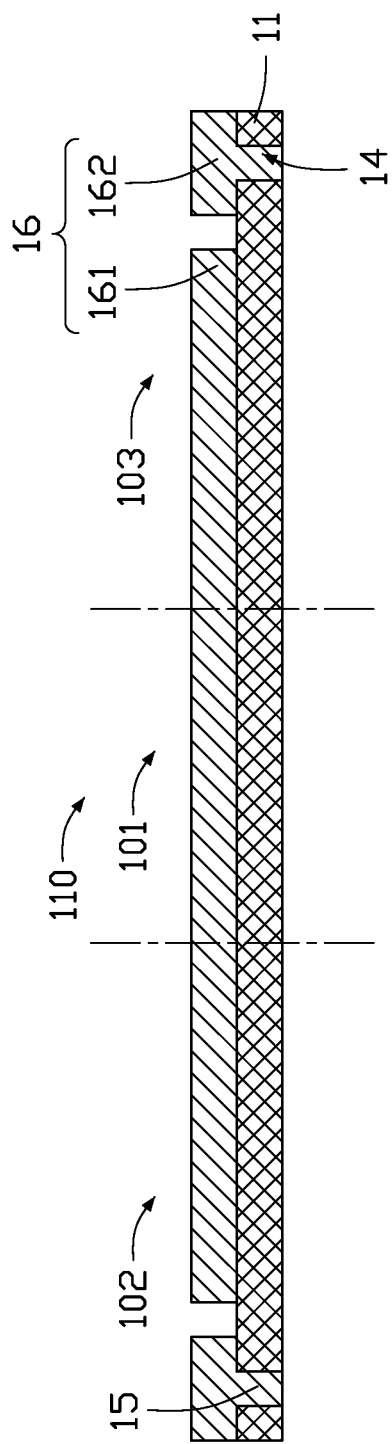
FIG. 5 is a cross-section view showing a first copper layer of the first copper clad laminate of FIG. 4 is etched to form an inner circuit layer, a second copper layer of the first copper clad laminate of FIG. 4 is removed from a substrate layer of the first copper clad laminate of FIG. 4, and then an inner circuit substrate board is obtained.

Fourthly, referring to FIG. 5, the second copper layer 13 is removed from the substrate layer 11, the first copper layer 12 is etched to form the inner circuit layer 16, and then the inner circuit substrate board 110 is obtained. In at least one embodiment, the inner circuit layer 16 is made from the first copper layer 12 by an image transfer process.

Figure 6:
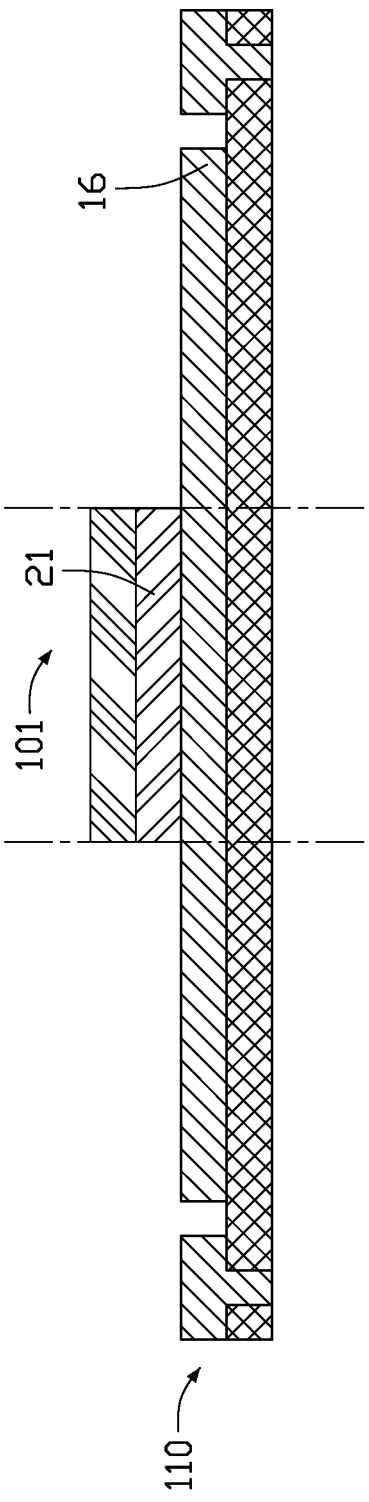
FIG. 6 is a cross-section view showing a second protecting layer is formed on the inner circuit substrate board.

At block 302, referring to FIG. 6, at least one second protecting layer 21 is formed on the inner circuit substrate board 110.

In at least one embodiment, a number of the second protecting layer 21 is one and the second protecting layer 21 is formed on the inner circuit layer 16 and located in the bendable area 101. In other embodiment, the number of the second protecting layer 21 may be two.

In at least one embodiment, the second protecting layer 21 is a cover layer. In other embodiments, the second protecting layer 21 may be a solder mask or a green paint layer.

In other embodiments, another second protecting layer 21 is formed on the substrate layer 11 and located in the bendable area 101.

In other embodiments, the block 302 can be omitted.

Figure 7:
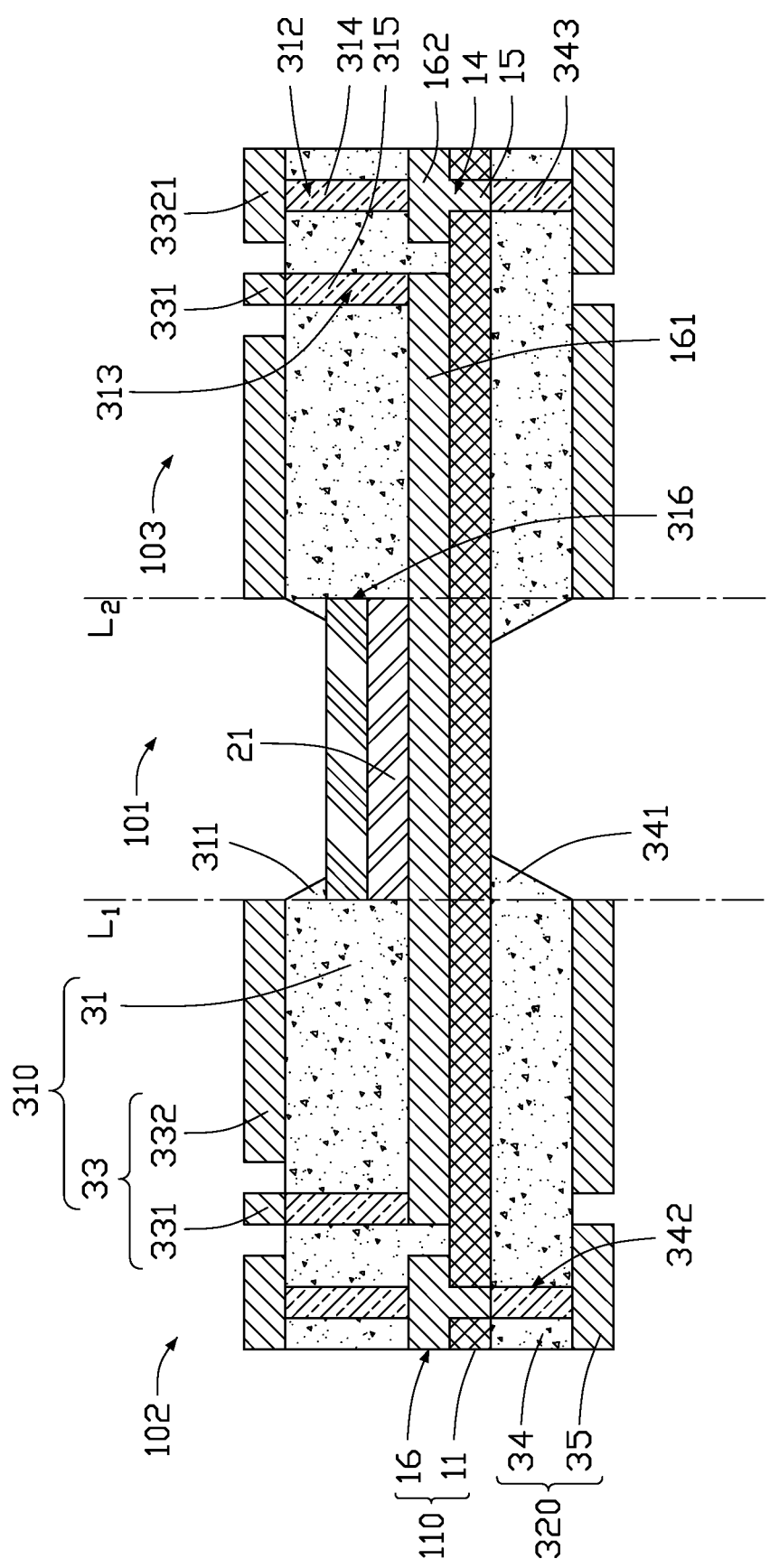
FIG. 7 is a cross-section view showing a first outer circuit substrate board and a second circuit substrate board are formed on two opposite surfaces of the inner circuit substrate board.

At block 303, referring to FIG. 7, a first outer circuit substrate board 310 and a second circuit substrate board 320 are respectively pressed on two opposite surfaces of the inner circuit substrate board 110.

The first outer circuit substrate board 310 and the second circuit substrate board 320 are located in the first transmission area 102 and the second transmission area 103.

In at least one embodiment, the first outer circuit substrate 310 includes a first dielectric layer 31 and a first outer circuit layer 33 formed on the first dielectric layer 31. The first dielectric layer 31 is formed on the inner circuit layer 16. The first dielectric layer 31 is located in the first transmission area 102 and the second transmission area 103.

In at least one embodiment, the first outer circuit layer 33 includes at least two signal terminals 331 and at least one first outer circuit 332. The first outer circuit 332 includes at least one earth terminal 3321. The at least two signal terminals 331 and the earth terminal 3321 are electrically insulated. The at least two signal terminals 331 can be used for component mounting, connected to other circuit boards or antennas, etc. The earth terminal 3321 can be used for earthing.

The first outer circuit substrate board 310 further includes a through groove 316. The through groove 316 penetrates the first dielectric layer 31 and the first outer circuit layer 33. An edge of the through groove 316 is corresponding to a first boundary "$L_1$" between the first transmission area 102 and the bendable area 101 and corresponding to a second boundary "$L_2$" between the second transmission area 102 and the bendable area 101.

During the first outer circuit substrate board 310 is pressed on the inner circuit substrate board 110, the first dielectric layer 31 will partially flow onto the second protecting layer 21 located in the bendable area 101, so that a first overflow portion 311 is formed at a break of the second protecting layer 21 and the first dielectric layer 31. In at least one embodiment, the first overflow portion 311 has a right-angled triangle shape.

At least two second blind holes 312 and at least two fourth blind holes 313 are defined in the first dielectric layer 31. One fourth blind hole 313 is corresponding to one signal terminal 321. One second blind hole 313 is corresponding to one earth terminal 3211. At least two first conductive pillars 314 are formed in the at least two second blind holes 312. At least two third conductive pillars 315 are formed in the at least two fourth blind holes 313. The at least two earth circuits 162 are electrically connected to the at least two earth terminals 3321 by the at least two first conductive pillars 314. Two ends of the first signal circuit 161 are electrically connected to the signal terminals 331 by the two third conductive pillars 315.

A material of the first conductive pillar 314 and the third conductive pillar 315 is copper paste or a metal conductive paste containing at least two of copper, tin, silver, and bismuth.

The second outer circuit substrate 320 includes a second dielectric layer 34 formed on the substrate layer 11 and a second outer circuit layer 35 formed on the second dielectric layer 34. The second dielectric layer 34 is located in the first transmission area 102 and the second transmission area 103.

During the second outer circuit substrate board 320 is pressed on the inner circuit substrate board 110, the second dielectric layer 34 will partially flow onto the substrate layer 11 located in the bendable area 101, so that a second overflow portion 341 is formed at a break of the substrate layer 11 and the second dielectric layer 34. In at least one embodiment, the second overflow portion 341 has a right-angled triangle shape.

At least two fourth blind holes 342 are defined in the second dielectric layer 34. One of the at least two fourth blind holes 342 are opposite to the at least two first blind holes 14. At least two second conductive pillars 343 are formed in the at least two fourth blind holes 342. One of the at least two second conductive pillars 343 is corresponding to one of the at least two fourth blind holes 342. One end of each second conductive pillar 343 is electrically connected to each copper pillar 15.

Materials of the first dielectric layer 31 and the second dielectric layer 34 are selected from at least one of liquid crystal polymer (LCP), polytetrafluoroethylene (PTFE), modified polyimide (MPI), and other materials.

A dielectric loss ($D_f$) of the first dielectric layer 31 is smaller than that of the substrate layer 11. A dielectric loss ($D_f$) of the second dielectric layer 34 is smaller than that of the substrate layer 11.

Figure 8:
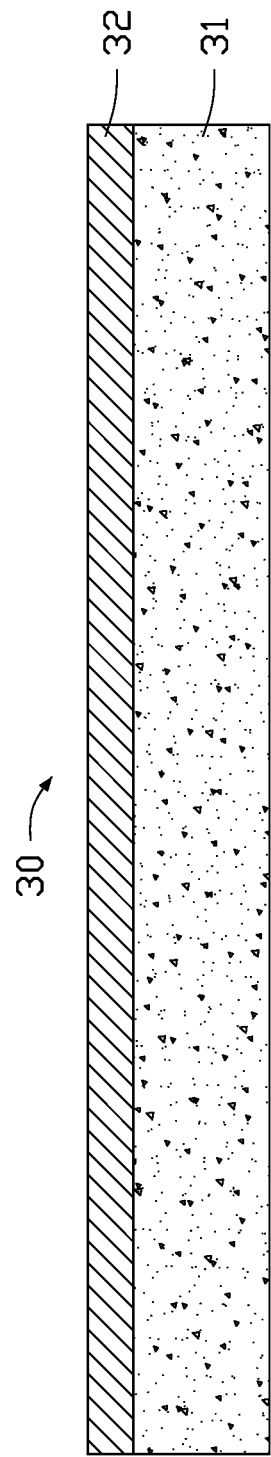
FIG. 8 is a cross-section view of a second copper clad laminate for manufacturing the first outer circuit substrate board and the second circuit substrate board of FIG. 7.

In at least one embodiment, referring to FIGS. 8-11, a method for manufacturing the first outer circuit substrate board 310 includes:

Firstly, referring to FIG. 8, a second copper clad laminate 30 is provided. The second copper clad laminate 30 includes the first dielectric layer 31 and a third copper layer 32 formed on the first dielectric layer 31.

Figure 9:
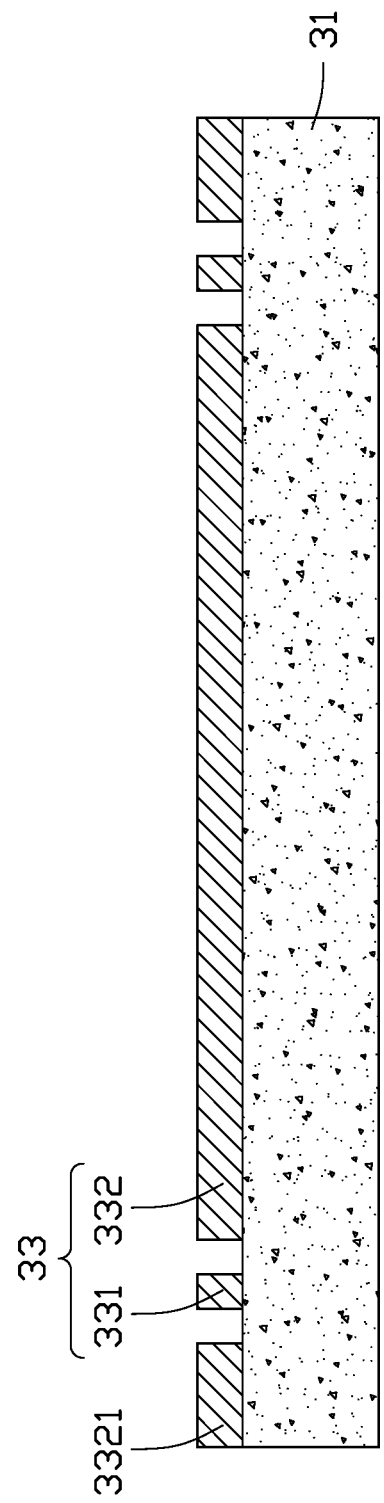
FIG. 9 is a cross-section view showing a third copper layer of the second copper clad laminate of FIG. 7 is etched to form a first outer circuit layer.

Secondly, referring to FIG. 9, the third copper layer 32 is manufactured to form the first outer circuit layer 33.

Figure 10:
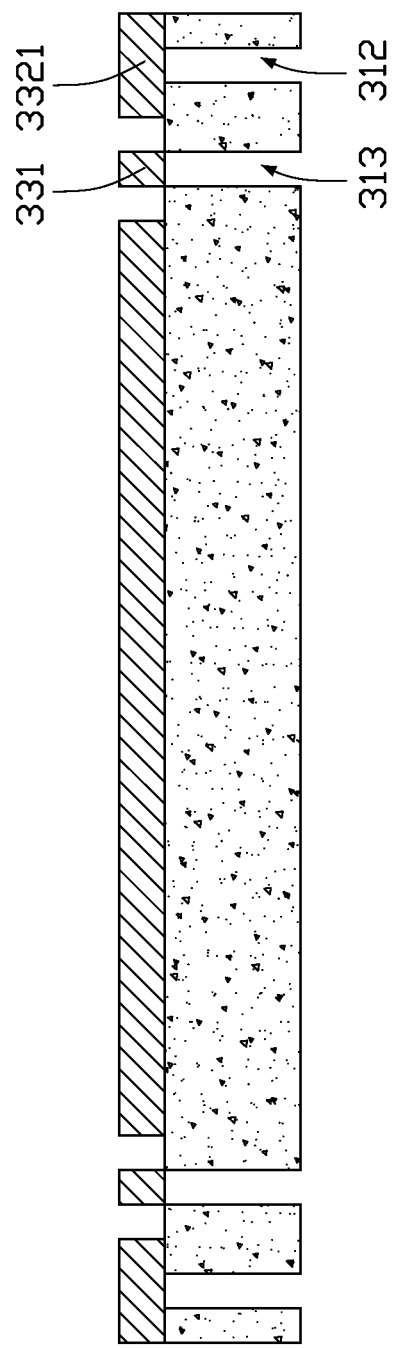
FIG. 10 is a cross-section view showing at least two second blind holes and at least two third blind holes are defined in a first dielectric layer of the second copper clad laminate of FIG. 9.

Thirdly, referring to FIG. 10, the at least two second blind holes 312 and the at least two fourth blind holes 313 are defined in the first dielectric layer 31.

Figure 11:
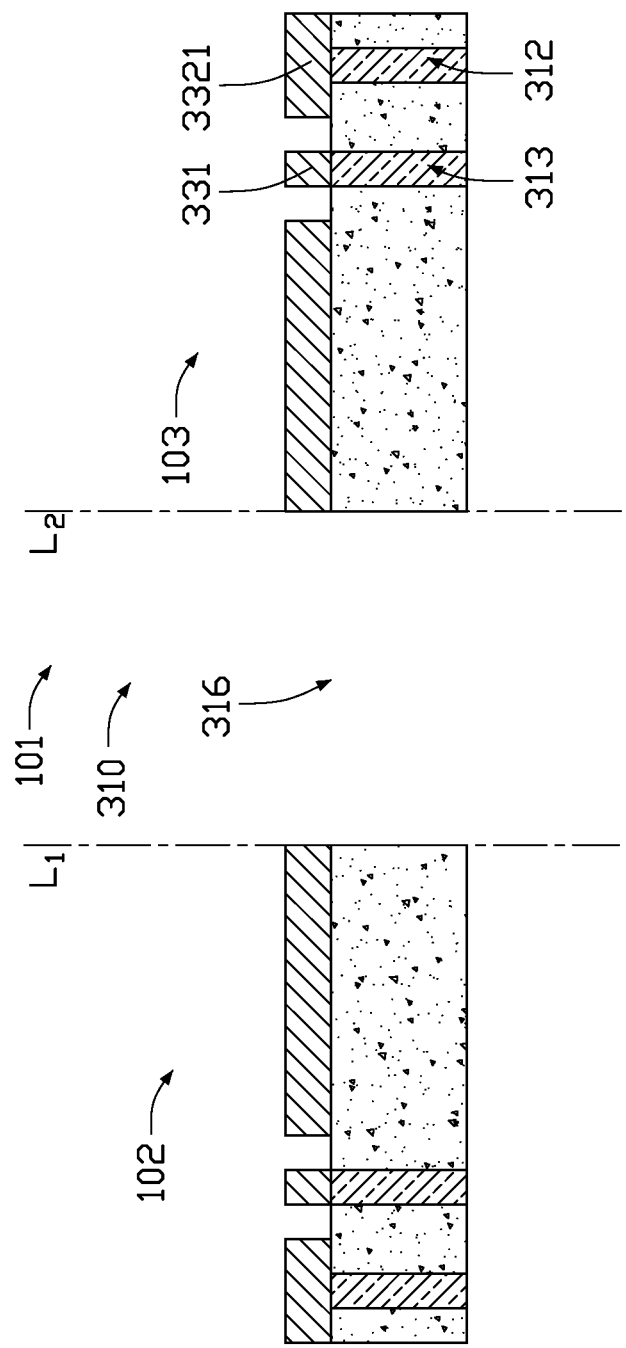
FIG. 11 is a cross-section view showing at least two first conductive pillars are formed in the at least two second blind holes, at least two third conductive pillars are formed in the at least two third blind holes, and a groove is defined in the second copper clad laminate to form the first outer circuit substrate board.

Fourthly, referring to FIG. 11, a copper paste or a metal conductive paste is filled in the at least two second blind holes 312 to form at least two first conductive pillars 314. The copper paste or the metal conductive paste is filled in the at least two fourth blind holes 313 to form the at least two third conductive pillars 315. The metal conductive paste contains at least two of copper, tin, silver, and bismuth. The through groove 316 is defined in the first dielectric layer 31 by laser or mechanical cutting or other method.

That is, in at least one embodiment, the first outer circuit substrate board 310 is formed on the inner circuit substrate board 110 when is made from the second copper clad laminate 30.

In other embodiments, the second copper clad laminate 30 can be formed on the inner circuit substrate board 110 by an adhesive layer, and then the second copper clad laminate 30 formed on the inner circuit substrate board 110 is manufactured to be the first outer circuit substrate board 310.

A method for manufacturing the second outer circuit substrate board 320 is similar to that of the first outer circuit substrate board 310.

Figure 12:
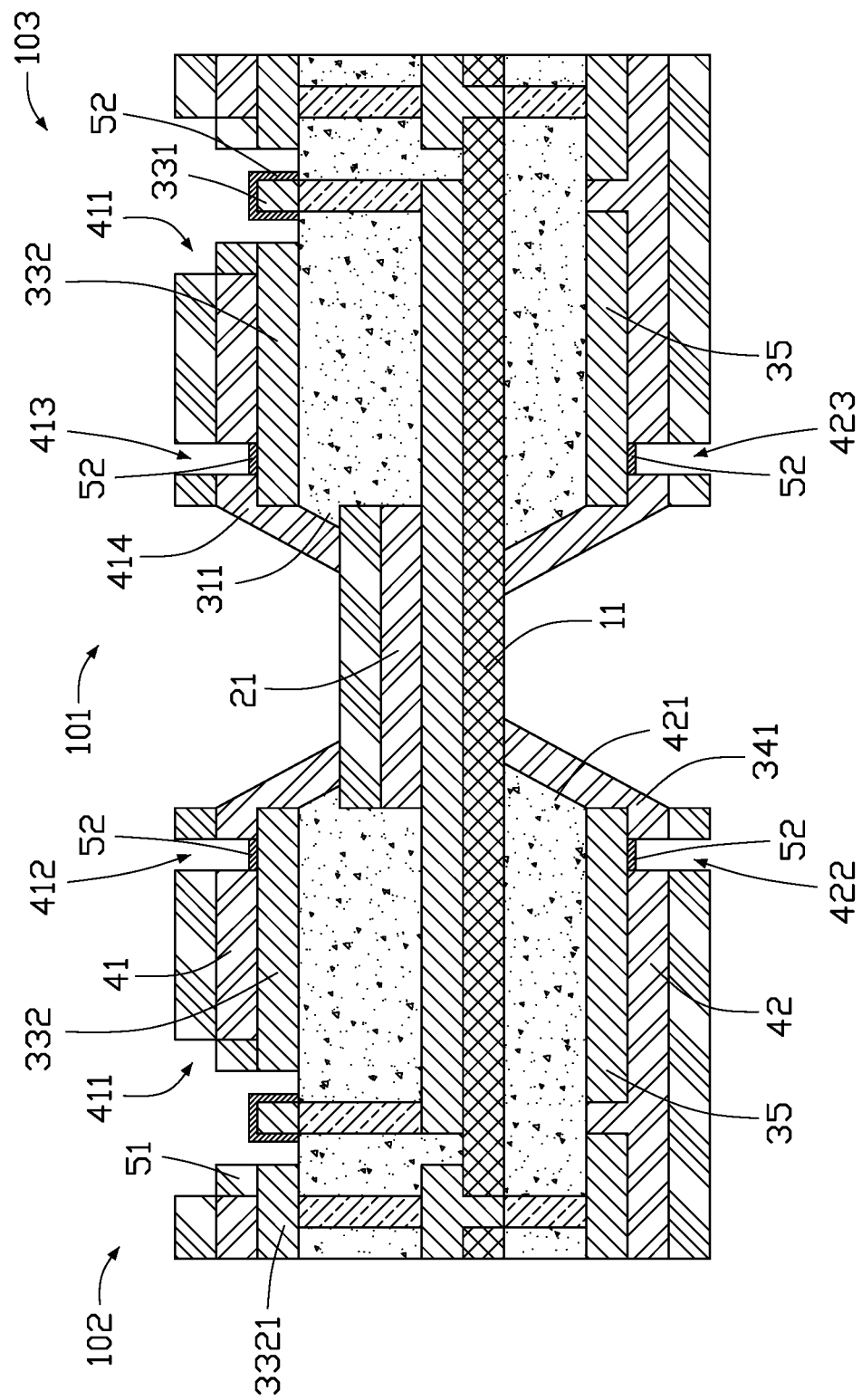
FIG. 12 is a cross-section view showing a first protecting layer is formed on the first outer circuit substrate board of FIG. 7, and a third protecting layer is formed on the second outer circuit substrate board of FIG. 7.

At block 304, referring to FIG. 12, a first protecting layer 41 is formed on the first outer circuit layer 33, and a third protecting layer 42 is formed on the second outer circuit layer 35.

In at least one embodiment, the first protecting layer 41 is located in the first transmission area 102 and the second transmission area 103. The third protecting layer 42 is located in the first transmission area 102 and the second transmission area 103. That is, the inner circuit substrate board 110 located in the bendable area 101 is exposed from the first protecting layer 41 and the third protecting layer 42.

In other embodiment, the first protecting layer 41 also may be located in the bendable area 101.

During the first protecting layer 41 is pressed on the first outer circuit layer 33, the first protecting layer 41 will partially flow onto the second protecting layer 21 located in the bendable area 101, so that a first excessive glue portion 414 is formed at a break of the second protecting layer 21 and the first protecting layer 41. The first excessive glue portion 414 is attached onto the first overflow portion 311 and the second protecting layer 21.

In at least one embodiment, a width of the first excessive glue portion 414 has a range from 0.1 microns to 0.4 microns.

During the third protecting layer 42 is pressed on the second outer circuit layer 35, the third protecting layer 42 will partially flow onto the substrate layer 11 located in the bendable area 101, so that a second excessive glue portion 421 is formed at a break of the substrate layer 11 and the third protecting layer 42. The second excessive glue portion 421 is attached onto the second overflow portion 341 and the substrate layer 11.

In at least one embodiment, a width of the second excessive glue portion 421 has a range from 0.1 microns to 0.4 microns.

At least two first openings 411, at least one third opening 412 and at least one fourth opening 413 are defined in the second cover film layer 41. One of the at least two first openings 411 and the third opening 412 are located in the first transmission area 102, and the other of the at least two first openings 411 and the fourth opening 413 are located in the second transmission area 103. The at least two signal terminals 331 and the at least two earth terminals 3321 are exposed from the at least two first openings 411. A portion of the first outer layer circuit 332 is exposed from the third opening 412 and the fourth opening 413.

At least one fifth opening 422 and at least one sixth opening 423 are defined in the third protecting layer 42. The fifth opening 422 is located in the first transmission area 102. The sixth opening 423 is located in the second transmission area 103. A portion of the second outer circuit layer 35 is exposed from the fifth opening 422 and the sixth opening 423.

At block 305, referring to FIG. 12, a solder mask 51 is formed on the at least two earth terminals 3321. A nickel gold layer 52 is formed on the first outer layer circuit 332 exposed from the third opening 412 and the fourth opening 413.

The nickel gold layer 52 is further formed on the second outer circuit layer 35 exposed from the fifth opening 422 and the sixth opening 423.

Figure 13:
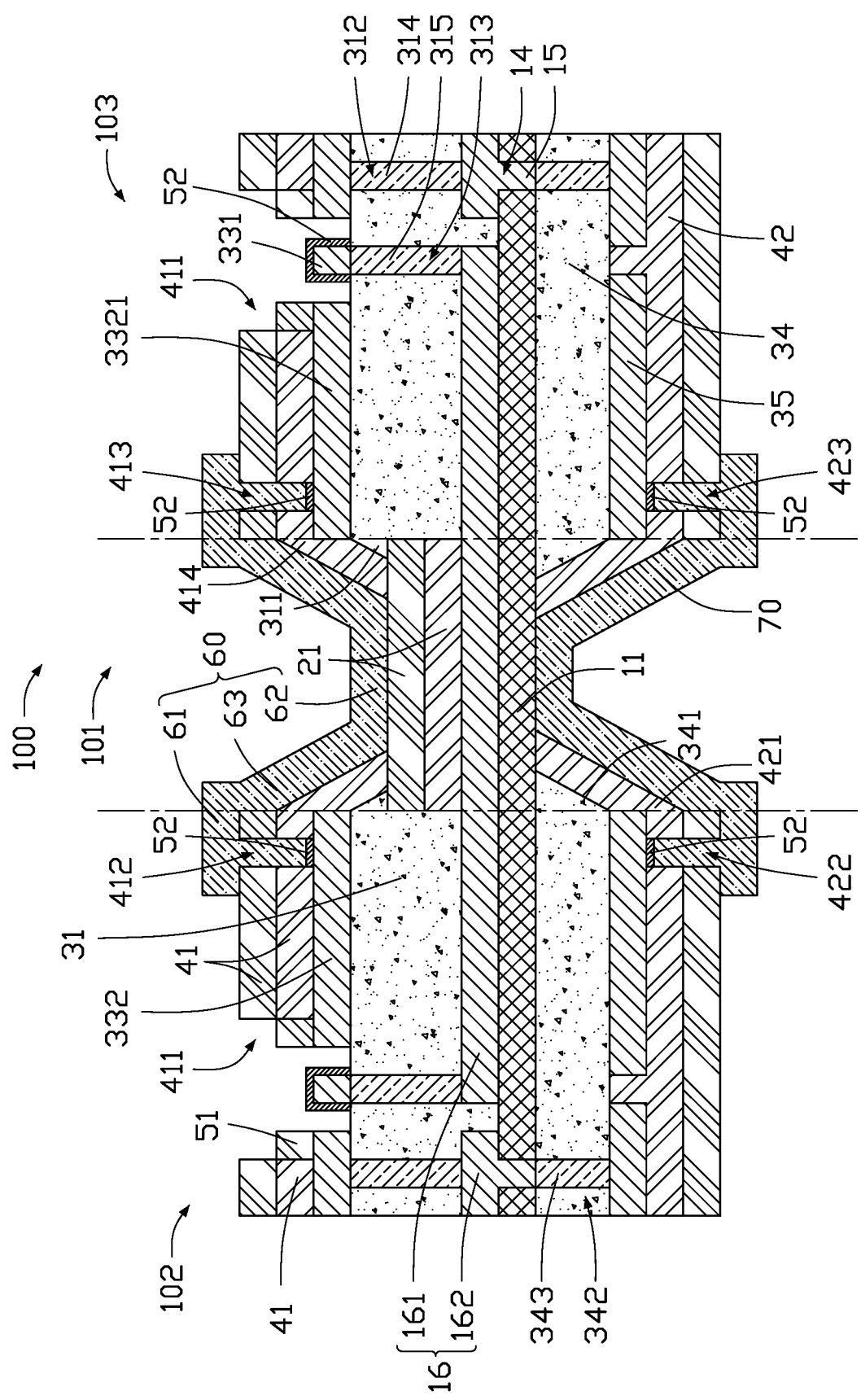
FIG. 13 is a cross-section view showing a first shielding layer is formed on the first protecting layer of FIG. 12, and a second shielding layer is formed on the third protecting layer of FIG. 12.

At block 306, referring to FIG. 13, a first shielding layer 60 is formed on the first protecting layer 41 and the second protecting layer 21. A second shielding layer 70 is formed on the third protecting layer 42 and the substrate layer 11 located in the bendable area 101. The first shielding layer 60 is electrically connected to the first outer circuit 332. The second shielding layer 70 is electrically connected to the second outer circuit layer 35.

The first shielding layer 60 includes two ends 61, a bottom 62, and two connecting portions 63. Each connecting portion 63 is connected to the bottom 62 and each end 61. The two ends 61 are formed on the two ends 61 and are electrically connected to the first outer circuit 332. The bottom 62 is formed on the e second protecting layer 21. The two connecting portions 63 are attached onto the first excessive glue portion 414.

A structure of the second shielding layer 70 is the same as a structure of the first shielding layer 60. Two connecting portions of the second shielding layer 70 are attached onto the second excessive glue portion 421.

Further, the two ends 61 of the first shielding layer 60 are electrically connected to the first outer circuit 332 exposed from the third opening 412 and the fourth opening 413. Two ends of the second shielding layer 70 are respectively electrically connected to the second outer circuit layer 35 exposed from the fifth opening 422 and the sixth opening 423.

FIG. 13 shows a first embodiment of a transmission circuit board 100. The transmission circuit board 100 includes a bendable area 101, a first transmission area 102, and a second transmission area 103. The first transmission area 102 and the second transmission area 103 are located on two sides of the bendable area 101. The first transmission area 102 and the second transmission area 103 both have a length that is greater than that of the bendable area 101.

The transmission circuit board 100 includes an inner circuit substrate board 110, a second protecting layer 21, a first outer circuit substrate board 310, a second circuit substrate board 320, a first protecting layer 41, a third protecting layer 42, a first shielding layer 60, and a second shielding layer 70. The second protecting layer 21 is formed on the inner circuit substrate board 110 and located in the bendable area 101. The first outer circuit substrate board 310 and the second circuit substrate board 320 are respectively formed on two opposite surfaces of the inner circuit substrate board 110 and are located in the first transmission area 102 and the second transmission area 103. The first protecting layer 41 is formed on the first outer circuit substrate board 310 and is located in the first transmission area 102 and the second transmission area 103. The third protecting layer 42 is formed on the second circuit substrate board 320 and is located in the first transmission area 102 and the second transmission area 103. The first shielding layer 60 is formed on the first protecting layer 41 and the second protecting layer 21. The second shielding layer 70 is formed on the third protecting layer 42 and the substrate layer 11 located in the bendable area 101. The first shielding layer 60 is electrically connected to the first outer circuit substrate board 310. The second shielding layer 70 is electrically connected to the second circuit substrate board 320.

In at least one embodiment, the inner circuit substrate board 110 includes a substrate layer 11 and an inner circuit layer 16 formed on the substrate layer 11. The substrate layer 11 is flexible. The inner circuit layer 16 includes at least one first signal circuit 161 and at least two earth circuits 162 located on opposite sides of the first signal circuit 161. The at least two earth circuits 162 are electrically insulated from the first signal circuit 161. In at least one embodiment, the first signal circuit 161 is located in the bendable area 101, the first transmission area 102, and the second transmission area 103. The at least two earth circuits 162 are located in the first transmission area 102 and Inside the second transmission area 103. At least two first blind holes 14 corresponding to the at least two earth circuits 162 are defined in the substrate layer 11. At least two copper pillars 15 are formed in the at least two first blind holes 14. The at least two copper pillars 15 are located in the first transmission area 102 and the second transmission area 103. One end of each copper pillar 15 is electrically connected to each earth circuit 162, and the other end of each copper pillar 15 is flush with or protrudes out of a surface of the substrate layer 11 away from the inner circuit layer 16.

In at least one embodiment, the second protecting layer 21 is formed on the inner circuit layer 16 and located in the bendable area 101.

In at least one embodiment, the first outer circuit substrate 310 includes a first dielectric layer 31 and a first outer circuit layer 33 formed on the first dielectric layer 31. The first dielectric layer 31 is formed on the inner circuit layer 16. The first dielectric layer 31 is located in the first transmission area 102 and the second transmission area 103.

In at least one embodiment, the first outer circuit layer 33 includes at least two signal terminals 331 and at least one first outer circuit 332. The first outer circuit 332 includes at least one earth terminal 3321. The at least two signal terminals 331 and the earth terminal 3321 are electrically insulated. The at least two signal terminals 331 can be used for component mounting, connected to other circuit boards or antennas, etc. The earth terminal 3321 can be used for earthing.

The first outer circuit substrate board 310 further includes a through groove 316. The through groove 316 penetrates the first dielectric layer 31 and the first outer circuit layer 33. An edge of the through groove 316 is corresponding to a first boundary "L$_1$" between the first transmission area 102 and the bendable area 101 and corresponding to a second boundary "L$_2$" between the second transmission area 102 and the bendable area 101.

During the first outer circuit substrate board 310 is pressed on the inner circuit substrate board 110, the first dielectric layer 31 will partially flow onto the second protecting layer 21 located in the bendable area 101, so that a first overflow portion 311 is formed at a break of the second protecting layer 21 and the first dielectric layer 31. In at least one embodiment, the first overflow portion 311 has a right-angled triangle shape.

At least two second blind holes 312 and at least two fourth blind holes 313 are defined in the first dielectric layer 31. One fourth blind hole 313 is corresponding to one signal terminal 321. One second blind hole 313 is corresponding to one earth terminal 3211. At least two first conductive pillars 314 are formed in the at least two second blind holes 312. At least two third conductive pillars 315 are formed in the at least two fourth blind holes 313. The at least two earth circuits 162 are electrically connected to the at least two earth terminals 3321 by the at least two first conductive pillars 314. Two ends of the first signal circuit 161 are electrically connected to the signal terminal 331 by two of the third conductive pillars 315.

A material of the first conductive pillar 314 and the third conductive pillar 315 is copper paste or a metal conductive paste containing at least two of copper, tin, silver, and bismuth.

The second outer circuit substrate 320 includes a second dielectric layer 34 formed on the substrate layer 11 and a second outer circuit layer 35 formed on the second dielectric layer 34. The second dielectric layer 34 is located in the first transmission area 102 and the second transmission area 103.

During the second outer circuit substrate board 320 is pressed on the inner circuit substrate board 110, the second dielectric layer 34 will partially flow onto the substrate layer 11 located in the bendable area 101, so that a second overflow portion 341 is formed at a break of the substrate layer 11 and the second dielectric layer 34. In at least one embodiment, the second overflow portion 341 has a right-angled triangle shape.

At least two fourth blind holes 342 are defined in the second dielectric layer 34. One of the at least two fourth blind holes 342 are opposite to the at least two first blind holes 14. At least two second conductive pillars 343 are formed in the at least two fourth blind holes 342. One of the at least two second conductive pillars 343 is corresponding to one of the at least two fourth blind holes 342. One end of each second conductive pillar 343 is electrically connected to each copper pillar 15.

Materials of the first dielectric layer 31 and the second dielectric layer 34 are selected from at least one of liquid crystal polymer (LCP), polytetrafluoroethylene (PTFE), modified polyimide (MPI), and other materials.

A dielectric loss ($D_f$) of the first dielectric layer 31 is smaller than that of the substrate layer 11. A dielectric loss ($D_f$) of the second dielectric layer 34 is smaller than that of the substrate layer 11.

A dielectric loss ($D_f$) of the first dielectric layer 31 is smaller than that of the substrate layer 11. A dielectric loss ($D_f$) of the second dielectric layer 34 is smaller than that of the substrate layer 11.

The first protecting layer 41 is formed on the first outer circuit layer 33. The third protecting layer 42 is formed on the second outer circuit layer 35.

In at least one embodiment, the first protecting layer 41 is located in the first transmission area 102 and the second transmission area 103. The third protecting layer 42 is located in the first transmission area 102 and the second transmission area 103. That is, the inner circuit substrate board 110 located in the bendable area 101 is exposed from the first protecting layer 41 and the third protecting layer 42.

During the first protecting layer 41 is pressed on the first outer circuit layer 33, the first protecting layer 41 will partially flow onto the second protecting layer 21 located in the bendable area 101, so that a first excessive glue portion 414 is formed at a break of the second protecting layer 21 and the first protecting layer 41. The first excessive glue portion 414 is attached onto the first overflow portion 311 and the second protecting layer 21.

In at least one embodiment, a width of the first excessive glue portion 414 has a range from 0.1 microns to 0.4 microns.

During the third protecting layer 42 is pressed on the second outer circuit layer 35, the third protecting layer 42 will partially flow onto the substrate layer 11 located in the bendable area 101, so that a second excessive glue portion 421 is formed at a break of the substrate layer 11 and the third protecting layer 42. The second excessive glue portion 421 is attached onto the second overflow portion 341 and the substrate layer 11.

In at least one embodiment, a width of the second excessive glue portion 421 has a range from 0.1 microns to 0.4 microns.

At least two first openings 411, at least one third opening 412 and at least one fourth opening 413 are defined in the second cover film layer 41. One of the at least two first openings 411 and the third opening 412 are located in the first transmission area 102, and the other of the at least two first openings 411 and the fourth opening 413 are located in the second transmission area 103. The at least two signal terminals 331 and the at least two earth terminals 3321 are exposed from the at least two first openings 411. A portion of the first outer layer circuit 332 is exposed from the third opening 412 and the fourth opening 413.

At least one fifth opening 422 and at least one sixth opening 423 are defined in the third protecting layer 42. The fifth opening 422 is located in the first transmission area 102. The sixth opening 423 is located in the second transmission area 103. A portion of the second outer circuit layer 35 is exposed from the fifth opening 422 and the sixth opening 423.

A solder mask 51 is formed on the at least two earth terminals 3321. A nickel gold layer 52 is formed on the first outer layer circuit 332 exposed from the third opening 412 and the fourth opening 413. The nickel gold layer 52 is further formed on the second outer circuit layer 35 exposed from the fifth opening 422 and the sixth opening 423.

The first shielding layer 60 includes two ends 61, a bottom 62, and two connecting portions 63. Each of the two connecting portions 63 is connected to the bottom 62 and each of the two ends 61. The two ends 61 are formed on the first protecting layer 41 and are electrically connected to the first outer circuit 332. The bottom 62 is formed on the second protecting layer 21. The two connecting portions 63 are attached onto the first excessive glue portion 414.

The first shielding layer 60 further includes a conductive layer (not shown). A thickness of the conductive layer has a range from 0.1 microns to 0.5 microns.

A structure of the second shielding layer 70 is the same as a structure of the first shielding layer 60. Two connecting portions of the second shielding layer 70 are attached onto the second excessive glue portion 421.

Further, the two ends 61 of the first shielding layer 60 are electrically connected to the first outer circuit 332 exposed from the third opening 412 and the fourth opening 413, respectively. Two ends of the second shielding layer 70 are respectively electrically connected to the second outer circuit layer 35 exposed from the fifth opening 422 and the sixth opening 423.

Figure 14:
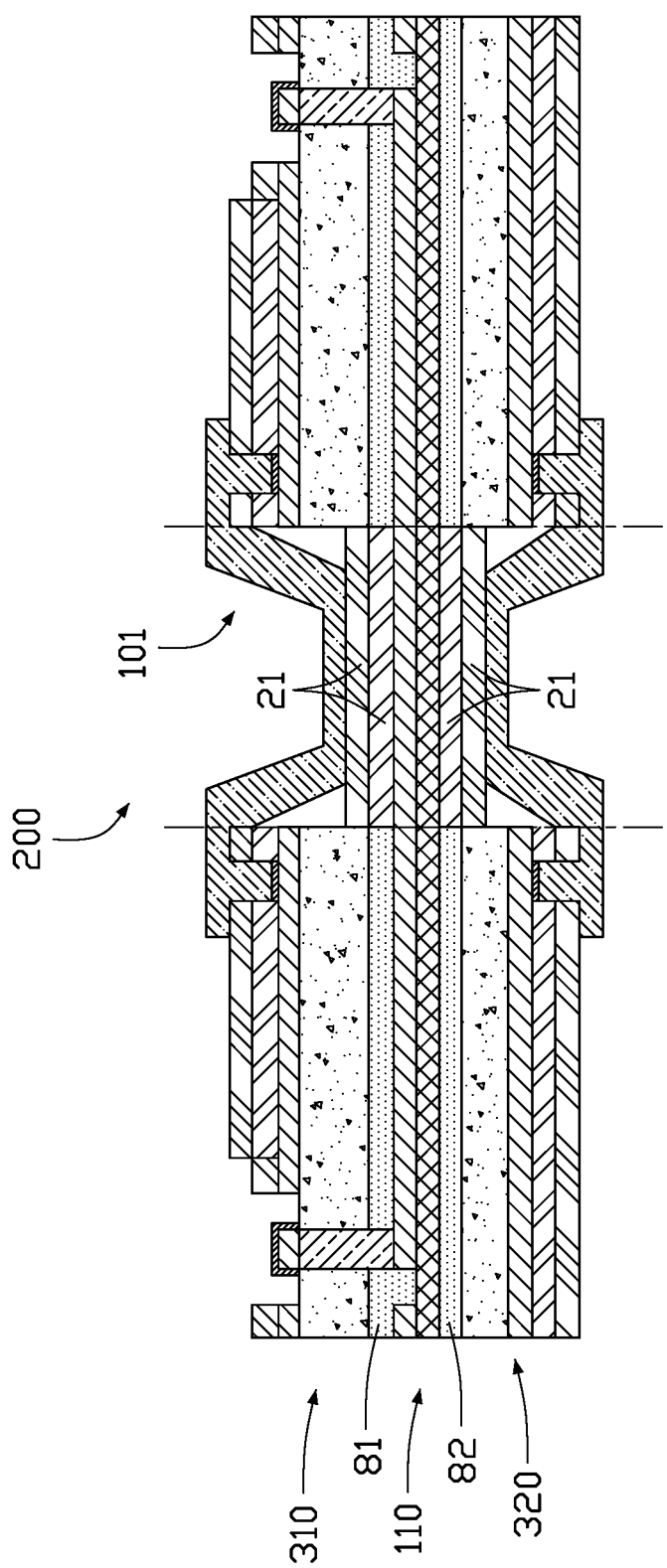
FIG. 14 is a cross-section view of a second embodiment of a transmission circuit board.

FIG. 14 shows a second embodiment of a transmission circuit board 200. A structure of the transmission circuit board 200 is similar to that of the transmission circuit board 100. The difference between the transmission circuit board 200 and the transmission circuit board 100 is that: the transmission circuit board 200 includes two first protecting layers 21. The two first protecting layers 21 are both formed on two opposite surfaces of the inner circuit substrate board 110 and located in the bendable area 101. The first outer circuit substrate board 310 is formed on the inner circuit substrate board 110 by a first adhesive layer 81. The second circuit substrate board 320 is formed on the inner circuit substrate board 110 by a second adhesive layer 82. In the substrate layer 11 has no the copper pillars 15.

Figure 15:
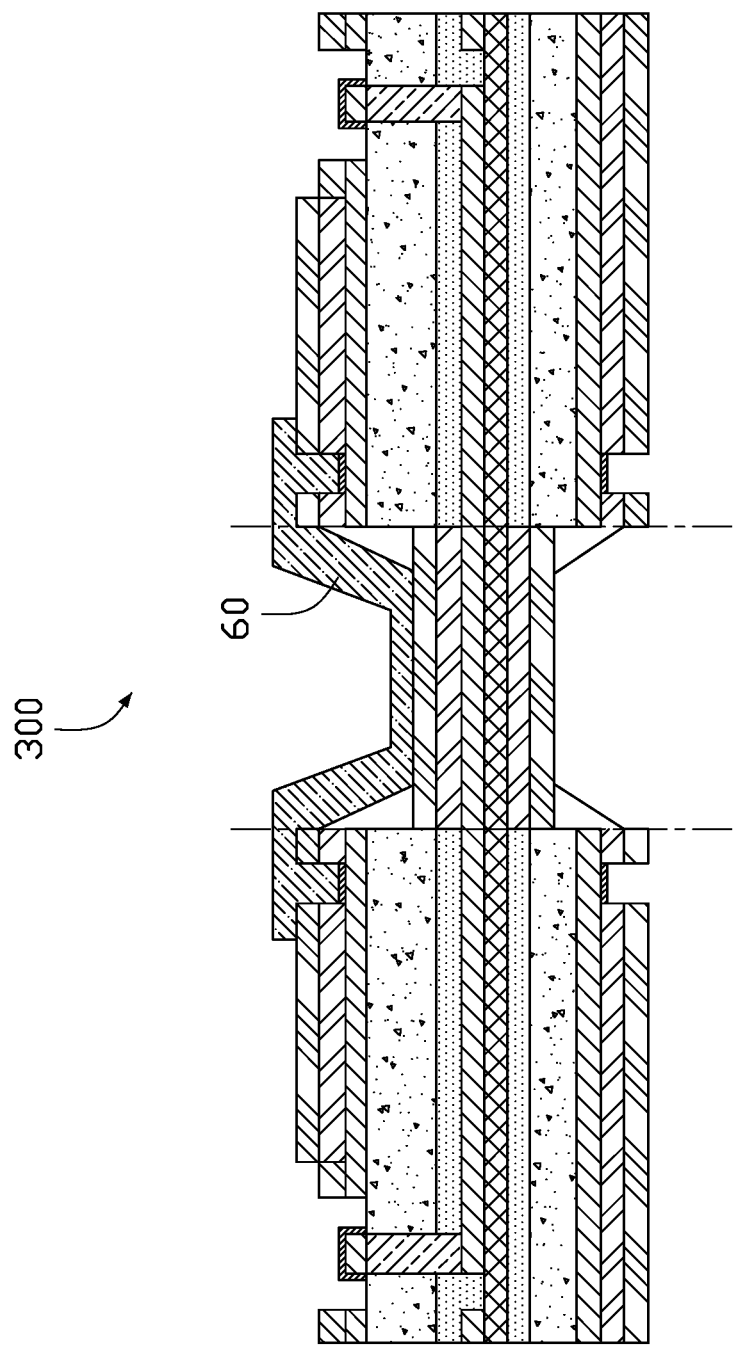
FIG. 15 is a cross-section view of a third embodiment of a transmission circuit board.

FIG. 15 shows a third embodiment of a transmission circuit board 300. A structure of the transmission circuit board 300 is similar to that of the transmission circuit board 200. The difference between the transmission circuit board 300 and the transmission circuit board 200 is that: the difference between the transmission circuit board 300 has no the second shielding layer 70.

Figure 16:
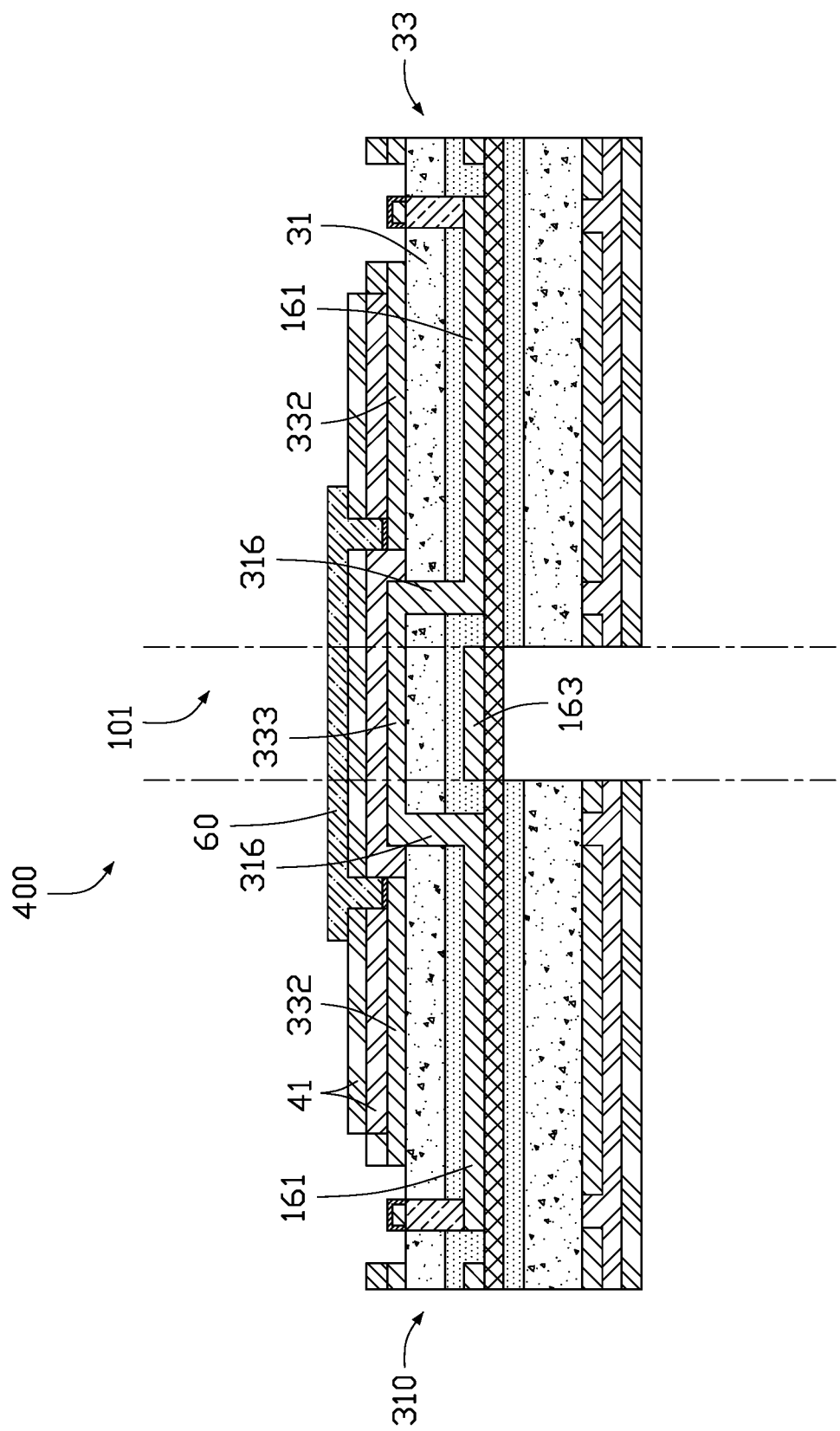
FIG. 16 is a cross-section view of a fourth embodiment of a transmission circuit board.

FIG. 16 shows a fourth embodiment of a transmission circuit board 400. A structure of the transmission circuit board 400 is similar to that of the transmission circuit board 200. The difference between the transmission circuit board 400 and the transmission circuit board 200 is that: the inner circuit layer 16 further includes two first signal circuits 161 and a second signal circuit 163. The second signal circuit 163 is located between the two first signal circuits 161 and located in the bendable area 101. The first adhesive layer 81 is further wrapped the second signal circuit 163. The first dielectric layer 31 is further located in the bendable area 101. The first outer circuit substrate board 310 is further located in the bendable area 101. The first outer circuit layer 33 further includes a second signal circuit 333. The second signal circuit 333 is located in the bendable area 101 and partially located in the first transmission area 102 and the second transmission area 103. The two first signal circuits 161 are electrically connected to the second signal circuit 333 by two fourth conductive pillars 316. The first protecting layer 41 is further located in the bendable area 101. The first shielding layer 60 is further formed on the first protecting layer 41 located in the bendable area 101. The transmission circuit board 400 does not include the second protecting layer 21.

With the embodiments described above, firstly, the transmission circuit board use a flexible material as the substrate layer, and set a bendable area between the first transmission area and the second transmission area, set one or two protecting layer at the bendable area, and set one or two shielding layer on the first outer circuit layer, so that the transmission circuit board has a good dynamic bending ability, thereby extending the service life of the transmission circuit board; secondly, the transmission circuit board set one or two shielding layer on the first outer circuit layer, the shielding layer is located in the bending and electrically connected to the first outer circuit layer or/and the second outer circuit layer, so that the shielding layer can earth and shield electromagnetic interference; thirdly, the at least two copper pillars embedded in the substrate layer can enhance a bending resistance of the inner circuit substrate board; fourthly, the first excessive glue portion and the second excessive glue portion can solve a problem of poor filling of the shielding layers, thereby preventing the shielding layer from breaking; fifthly, the two first signal circuits, the second signal circuits, and the two fourth conductive pillars can avoid the shielding layers breaking.

The embodiments shown and described above are only examples. Many details are often found in the art such as the other features of a transmission circuit board and a method for manufacturing the transmission circuit board. Therefore, many such details are neither shown nor described. Even though numerous characteristics and advantages of the present disclosure have been positioned forth in the foregoing description, together with details of the structure and function of the present disclosure, the disclosure is illustrative only, and changes can be made in the detail, including in matters of shape, size, and arrangement of the parts within the principles of the present disclosure, up to and including the full extent established by the broad general meaning of the terms used in the claims. It will therefore be appreciated that the embodiments described above can be modified within the scope of the claims.

What is claimed is:

1. A transmission circuit board comprising:
   a bendable area;
   a first transmission area;
   a second transmission area; wherein each of the first transmission area and the second transmission area is connected to the bendable area;
   a substrate layer;
   an inner circuit layer on the substrate layer; wherein the inner circuit layer comprises at least one first signal circuit;
   a first dielectric layer on the inner circuit layer; wherein the first dielectric layer is in the first transmission area and the second transmission area;
   a first outer circuit layer on the first dielectric layer; wherein each end of the first signal circuit is electrically connected to the first outer circuit layer;
   a first protecting formed on the first outer circuit layer; and
   a first shielding layer on the first protecting layer, electrically connected to the first outer circuit layer, and the first shielding layer being in the bendable area.

2. The transmission circuit board of claim 1, wherein the first shielding layer comprises two ends, a bottom, and two connecting portions; each of the two connecting portions is connected to the bottom and a respective one of the two ends; each of the two ends is on the first protecting layer and electrically connected to the first outer circuit layer; and the bottom is formed on the first outer circuit layer.

3. The transmission circuit board of claim 2, further comprising a second dielectric layer on the substrate layer, a second outer circuit layer on the second dielectric layer, and a third protecting layer on the second outer circuit layer; wherein the second dielectric layer is in the first transmission area and the second transmission area, the second outer circuit layer is in the first transmission area and the second transmission area, and the third protecting layer is in the first transmission area and the second transmission area.

4. The transmission circuit board of claim 3, further comprising a second shielding layer on the third protecting layer, electrically connected to the second outer circuit layer, and the second shielding layer being in the bendable area.

5. The transmission circuit board of claim 2, further comprising a second protecting layer on the inner circuit layer, wherein the second protecting layer is in the bendable area; and the bottom is on the second protecting layer.

6. The transmission circuit board of claim 5, wherein a first overflow portion is at a break of the second protecting layer and the first dielectric layer; a first excessive glue portion is at a break of the second protecting layer and the first protecting layer; and the first excessive glue portion is respectively attached onto the first overflow portion and the second protecting layer.

7. The transmission circuit board of claim 5, further comprising an additional second protecting layer on the substrate layer, wherein the additional second protecting layer is in the bendable area.

8. The transmission circuit board of claim 7, further comprising a second shielding layer on the third protecting layer, electrically connected to the second outer circuit layer, and the second shielding layer being in the bendable area; wherein the second shielding layer is on the additional second protecting layer.

9. The transmission circuit board of claim 1, wherein the inner circuit layer further comprises at least two earth circuits on opposite sides of the first signal circuit; the transmission circuit board further comprises at least two copper pillars embedded in the substrate layer; the at least two copper pillars are in the first transmission area and the second transmission area; one end of each of the copper pillars is electrically connected to a respective one of the two earth circuits, and another end of each of the copper pillars is flush with or protrudes out of a surface of the substrate layer away from the inner circuit layer.

10. The transmission circuit board of claim 9, wherein at least two first conductive pillars are embedded in the first dielectric layer; the first outer circuit layer comprises at least two signal terminals and at least one first outer circuit; the first outer circuit comprises at least one earth terminal; each of the at least two earth circuits is electrically connected to a respective one of the at least two earth terminals by a respective one of the at least two first conductive pillars; each of the two ends of the first signal circuit is electrically connected to the signal terminals by the respective one of the two third conductive pillars.

11. The transmission circuit board of claim 1, wherein the first dielectric layer is adhered to the inner circuit layer by a first adhesive layer; the first dielectric layer is in the first transmission area and the second transmission area.

12. The transmission circuit board of claim 1, wherein the inner circuit layer further comprises two first signal circuits and a second signal circuit; the second signal circuit is between the two first signal circuits and in the bendable area; the first outer circuit layer further comprises a second signal circuit; the first dielectric layer is in the bendable area; the second signal circuit is in the bendable area and partially in the first transmission area and the second transmission area; each of the two first signal circuits is electrically connected to the second signal circuit by a respective one of the two fourth conductive pillars; and the two fourth conductive pillars are embedded in the first dielectric layer located in the first transmission area and the second transmission area.

13. The transmission circuit board of claim 12, wherein the first protecting layer is in the bendable area; and the first shielding layer is on the first protecting layer which is in the bendable area.

14. The transmission circuit board of claim 13, wherein the first dielectric layer is adhered to the inner circuit layer by a first adhesive layer; the first dielectric layer is in the bendable area, the first transmission area, and the second transmission area; the first adhesive layer wrapped the second signal circuit.

* * * * *